United States Patent
Ibbetson et al.

(10) Patent No.: US 8,558,252 B2
(45) Date of Patent: Oct. 15, 2013

(54) WHITE LEDS WITH EMISSION WAVELENGTH CORRECTION

(75) Inventors: James Ibbetson, Santa Barbara, CA (US); Bernd Keller, Santa Barbara, CA (US); Ronan Letoquin, Fremont, CA (US); Matthew Donofrio, Raleigh, NC (US); Michael Bergmann, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/219,486

(22) Filed: Aug. 26, 2011

(65) Prior Publication Data

US 2013/0049021 A1  Feb. 28, 2013

(51) Int. Cl.
*H01L 29/18* (2006.01)
*H01L 29/205* (2006.01)
*H01L 33/00* (2010.01)
*H01L 21/00* (2006.01)

(52) U.S. Cl.
USPC .............. 257/88; 257/91; 257/98; 438/29

(58) Field of Classification Search
USPC ............. 257/79, 88, 98; 438/27, 29
See application file for complete search history.

(56) References Cited

U.S. PATENT DOCUMENTS

| | | | |
|---|---|---|---|
| 4,946,547 A | 8/1990 | Palmour et al. | |
| 5,200,022 A | 4/1993 | Kong et al. | |
| RE34,861 E | 2/1995 | Davis et al. | |
| 5,813,753 A | 9/1998 | Vriens et al. | |
| 5,959,316 A | 9/1999 | Lowery | |
| 6,483,196 B1 | 11/2002 | Wojnarowski et al. | 257/778 |
| 6,577,073 B2 | 6/2003 | Shimizu et al. | |
| 6,598,998 B2 | 7/2003 | West et al. | 362/307 |
| 6,746,295 B2 | 6/2004 | Sorg | 445/24 |
| 6,860,621 B2 | 3/2005 | Bachi et al. | 362/373 |
| 7,049,159 B2 | 5/2006 | Lowery | 438/22 |
| 7,260,123 B2 * | 8/2007 | Sato | 372/22 |
| 7,655,957 B2 | 2/2010 | Loh et al. | 257/99 |

(Continued)

FOREIGN PATENT DOCUMENTS

EP  1 059 678 A  12/2000
EP  1198016 A2  4/2002

(Continued)

OTHER PUBLICATIONS

MacAdam Ellipses, "Frequency Asked Questions", Document No. FAQ0026-0999, Osram Sylvania (2000).*

(Continued)

*Primary Examiner* — Long K Tran
*Assistant Examiner* — Dzung Tran
(74) *Attorney, Agent, or Firm* — Koppel, Patrick, Heybl & Philpott

(57) ABSTRACT

Methods for fabricating semiconductor devices such as LED chips with emission wavelength correction and devices fabricated using these methods. Different embodiments include sequential coating methods that provide two or more coatings or layers of conversion material over LEDs, which can be done at the wafer level. The methods are particularly applicable to fabricating LED chips that emit a warm white light, which typically requires covering LEDs with one or more wavelength conversion materials such as phosphors. In one embodiment, a base wavelength conversion material is applied to the semiconductor devices. A portion of the base conversion material is removed. At least two different tuning wavelength conversion materials are also applied to the semiconductor devices, either before or after the application of the base conversion material.

37 Claims, 5 Drawing Sheets

(56) References Cited

U.S. PATENT DOCUMENTS

| | | | |
|---|---|---|---|
| 7,804,103 B1 * | 9/2010 | Zhai et al. | 257/98 |
| 7,858,403 B2 | 12/2010 | Hiller et al. | |
| 2002/0070449 A1 | 6/2002 | Yagi et al. | 257/734 |
| 2004/0080939 A1 | 4/2004 | Braddell et al. | 362/240 |
| 2004/0124429 A1 | 7/2004 | Stokes et al. | 257/98 |
| 2004/0264193 A1 * | 12/2004 | Okumura | 362/276 |
| 2005/0122031 A1 | 6/2005 | Itai et al. | 313/498 |
| 2005/0135105 A1 | 6/2005 | Teixeira et al. | 362/294 |
| 2005/0280894 A1 | 12/2005 | Hartkop et al. | 359/464 |
| 2006/0034082 A1 | 2/2006 | Park et al. | 362/268 |
| 2006/0060874 A1 | 3/2006 | Edmond et al. | |
| 2006/0086418 A1 | 4/2006 | Williams | |
| 2006/0258028 A1 | 11/2006 | Paolini et al. | |
| 2007/0165403 A1 | 7/2007 | Park et al. | 362/247 |
| 2008/0173884 A1 | 7/2008 | Chitnis et al. | 257/98 |
| 2008/0179611 A1 | 7/2008 | Chitnis et al. | |
| 2009/0057690 A1 | 3/2009 | Chakraborty | |
| 2009/0086475 A1 * | 4/2009 | Caruso et al. | 362/231 |
| 2009/0117672 A1 | 5/2009 | Caruso et al. | |
| 2009/0261358 A1 * | 10/2009 | Chitnis et al. | 257/88 |
| 2010/0155750 A1 * | 6/2010 | Donofrio | 257/91 |
| 2010/0308361 A1 * | 12/2010 | Beeson et al. | 257/98 |
| 2011/0070668 A1 | 3/2011 | Hiller et al. | |
| 2011/0070669 A1 | 3/2011 | Hiller et al. | |
| 2011/0180829 A1 | 7/2011 | Cho | |

FOREIGN PATENT DOCUMENTS

| | | |
|---|---|---|
| JP | 11040848 | 2/1999 |
| JP | 2000-315823 | 11/2000 |
| JP | 2000315823 | 11/2000 |
| JP | 2002009347 | 1/2002 |
| JP | 2003-197973 | 7/2003 |
| JP | 2003-303999 | 10/2003 |
| JP | 2004179343 | 6/2004 |
| JP | 2005508093 | 3/2005 |
| JP | 2005-298817 A | 10/2005 |
| JP | 2006-054209 A | 2/2006 |
| JP | 2006303303 | 11/2006 |
| JP | 2006303373 | 11/2006 |
| JP | 2007324608 | 12/2007 |

OTHER PUBLICATIONS

Nicha Corp., White LED, Part No. NSPW300BS, Specifications, 15 pages.
Nicha Corp., White LED, Part No. NSPW312BS, Specifications, 15 pages.
Cree, Inc., EZBright LED's, EZ1000, EZ700, EZ600, EZ400, Data Sheets.
Cree, Inc., XThin LED's, XT290, Data Sheet, 6 pages.
U.S. Appl. No. 61/072,546, filed Mar. 31, 2008, to Ashay Chitnis, et al.
Cree, Inc., EZBright290, Data Sheets.
Pi, M-501 Precision Vertical Stage, Data Sheets, 4-60 to 4-61.
Second Office Action from Chinese Patent Application No. 200780012387.0, dated Sep. 5, 2012.
Decision of Rejection for Japanese Patent Application No. 2009-504205, dated Jul. 31, 2012.
First Office Action from Chinese Patent Application No. 200980121201.4, dated Jul. 4, 2012.
First Office Action for European Patent Application No. 07754163.9 dated Feb. 28, 2011.
Notice of Rejection for Japanese Patent Application No. 2009-504205 issued Sep. 13, 2011.
Third Office Action from Chinese Patent Appl. No. 2007800123870, dated Feb. 14, 2013.
Second Office Action from Chinese Application No. 200980121201.4, Dated: Mar. 5, 2013.
Interrogatory from Japanese Patent Appl. No. 2009-504205, dated Mar. 19, 2013.
International Search Report and Written Opinion from PCT Appl. No. PCT/US2012/050794, dated Jan. 10, 2013.
Notice of Reasons for Rejection from Japanese Patent Application No. 2011-502981, dated Feb. 5, 2013.
Office Action from Korean Patent Application No. 10-2008-7026531, dated Feb. 14, 2013.

* cited by examiner

US 8,558,252 B2

WHITE LEDS WITH EMISSION WAVELENGTH CORRECTION

BACKGROUND OF THE INVENTION

1. Field of the Invention

Embodiments of the invention relate to light emitting diodes (LEDs) and, more particularly, to white LEDs utilizing wavelength conversion materials.

2. Description of the Related Art

A light emitting diode (LED) is a solid state device that converts electric energy to light and generally comprises one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Conventional LEDs cannot generate white light from their active layers. Light from a blue emitting LED has been converted to white light by surrounding the LED with a yellow phosphor, polymer, or dye, with a typical phosphor being cerium-doped yttrium aluminum garnet (Ce:YAG). [See Nichia Corp. white LED, Part No. NSPW300BS, NSPW312BS, etc.; Cree® Inc. EZBright™ LEDs, XThin™ LEDs, etc.; See also U.S. Pat. No. 5,959,316 to Lowrey, "Multiple Encapsulation of Phosphor-LED Devices"]. The surrounding phosphor material converts the wavelength of some of the LED's blue light, changing its color. Some of the blue light passes through the phosphor without being changed while a substantial portion of the light is converted. Depending on the phosphor properties the blue light can be converted to green, yellow, orange, or red light, or a combination thereof to create white light. In another approach light from a violet or ultraviolet emitting LED has been converted to white light by surrounding the LED with multicolor phosphors or dyes.

The spectrum of the light emitted by an LED depends on the spectrum (or wavelength) of the exciting (e.g. blue LED) light source, the amount of light converted by the phosphor, and the emission spectrum of the phosphor. Phosphors have excitation and absorption characteristics that vary with the wavelength of the exciting light source. Thus, the overall color of light emitted by a LED depends on many factors that include the LED wavelength, the phosphor mechanical and optical properties, and the phosphor layer thickness. This provides a great deal of flexibility in tailoring the output of LEDs but it also requires careful control of many parameters to insure a particular color.

The human eye is relatively sensitive to variations in emission wavelengths and can detect relatively small differences in emission wavelengths or color. Perceptible variations in color emitted by LEDs designed to emit a single color of light can reduce customer satisfaction and reduce overall acceptance of LEDs for commercial uses. In an effort to provide LEDs that emit light of the same or similar wavelength, the LEDs can be tested and sorted by color or brightness. This process is generally known in the art as binning. Each bin typically contains LEDs from one color and brightness group and is typically identified by a bin code. White emitting LEDs can be sorted by chromaticity (color) and luminous flux (brightness). Color LEDs can be sorted by dominant wavelength, luminous flux, or, in the case of certain colors such as royal blue, by radiant flux. LEDs can be shipped, for example, on reels containing LEDs from one bin and labeled with the appropriate bin code.

FIG. 3A shows one example of binning chromaticity regions plotted on the 1931 CIE Coordinate system for commercially available white emitting Cree® XLamp® XR-E and XR-C LEDs provided by Cree, Inc. Each of these regions corresponds to a particular chromaticity range of white LEDs with the regions shown surrounding the black body curve or black body locus (BBL). Each of these regions is designed to designate chromaticity variations that are within acceptable ranges for a given application.

FIG. 3B shows an example of how LED color can be affected by the wavelength of the blue LED used to excite the phosphor. In this case, white-emitting LEDs are fabricated by combining blue EZBright LED chips with a yellow-emitting phosphor coat, and then encapsulating them in a clear silicone lens. The emission wavelength of the LED chips is intentionally varied from 450 nm to 465 nm. The phosphor coating is the same for all devices. The chromaticity of the combined light is observed to vary across a number of color bins depending on the LED chip wavelength, due to the inherent wavelength-dependent phosphor properties. Achieving a particular chromaticity for all blue wavelengths therefore requires tailoring one or more phosphor properties for each blue wavelength.

LEDs and phosphors can be integrated at the LED wafer level, chip level, or at the package level. There has been recent interest in coating LEDs with a phosphor at the wafer level to reduce the cost and complexity of fabrication. See, for example, U.S. patent application Ser. Nos. 11/656,759 and 11/899,790 to Chitnis, et al., both of which are commonly owned with the present application and incorporated by reference herein. LEDs across a wafer can also have different emission characteristics or color spread. FIG. 1 shows one example of a wavelength emission map 10 for a wafer of blue emitting LEDs showing wavelength variations across the wafer, and each wafer can have its own unique emission map. In the map shown, the wavelength distribution is approximately 450 to 460 nm, although other wafers can experience different distributions in different wafer areas. This distribution can result from different factors such as variations in the epitaxial material during growth of the LEDs, or from variations in the flatness (i.e., bow) of the growth substrate.

The wafer can be coated with a conversion material (e.g., phosphor). FIG. 2 shows a conversion material thickness map 20 following coating. In some fabrication processes the coating can be planarized using known methods. The thickness of the coating can vary across the wafer due to different factors such as variations in the thickness of the underlying wafer and in planarization variations. In the embodiment shown, the wafer experiences a total thickness variation of approximately 3 µm. The wavelength emission variations of the LEDs and thickness variations of the conversion material across the wafer can result in a spread of emission wavelengths or color points of the LED chips singulated from the wafer, similar to the results shown in FIG. 3B. This spread can be exacerbated by phosphor loading or concentration variations across the wafer.

SUMMARY OF THE INVENTION

A method for fabricating light emitting devices according to an embodiment of the present invention comprises the following steps. A plurality of semiconductor devices is coated with a base wavelength conversion material, the semiconductor devices emitting over a range of wavelengths. Tuning wavelength conversion material is disposed on the plurality of semiconductor devices, the tuning wavelength material comprising at least one tuning phosphor.

A light emitting device according to an embodiment of the present invention comprises the following elements. A base conversion layer comprising a first wavelength conversion material is on an emitter structure. A tuning conversion layer comprises at least second and third wavelength conversion materials on the emitter structure.

A light emitter package according to an embodiment of the present invention comprises the following elements. At least one light emitter is on a surface. First and second electrodes are electrically connected to the at least one emitter. A base conversion layer comprises a first wavelength conversion material. A tuning conversion layer comprises at least second and third wavelength conversion materials.

DETAILED DESCRIPTION OF THE INVENTION

Figure 1:
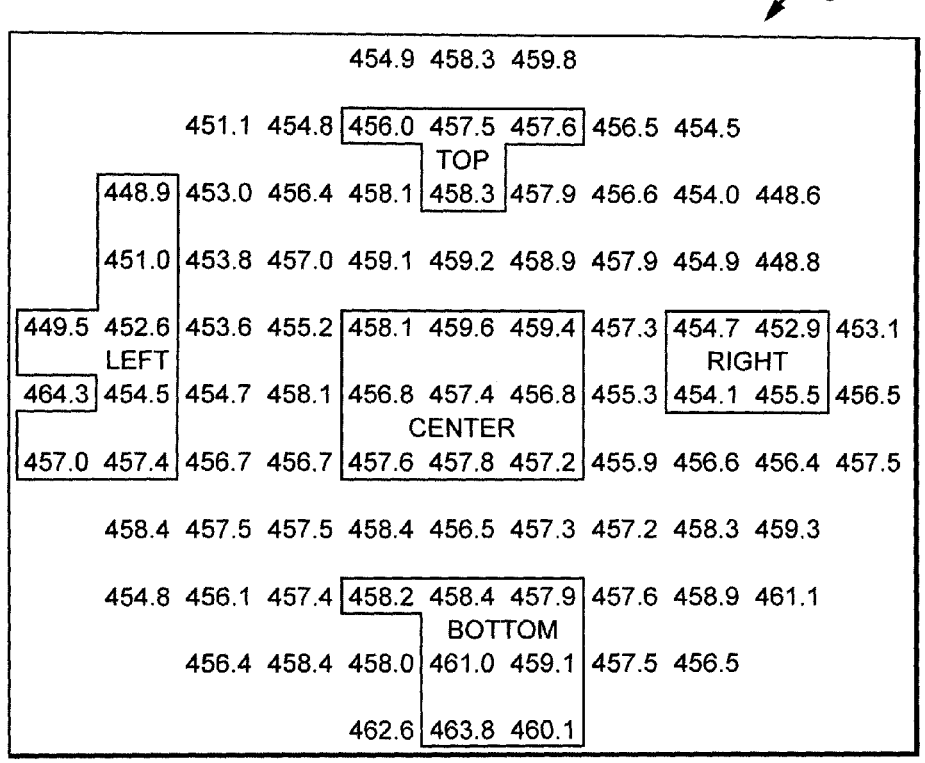
FIG. 1 is a wavelength emission map for an exemplary semiconductor wafer.
Figure 2:
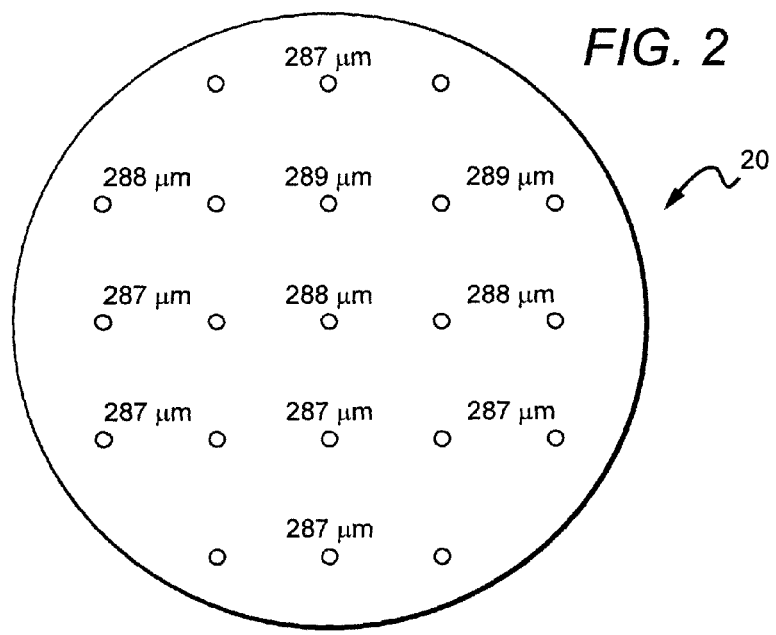
FIG. 2 is a conversion material thickness map for an exemplary semiconductor wafer.
Figure 3A:
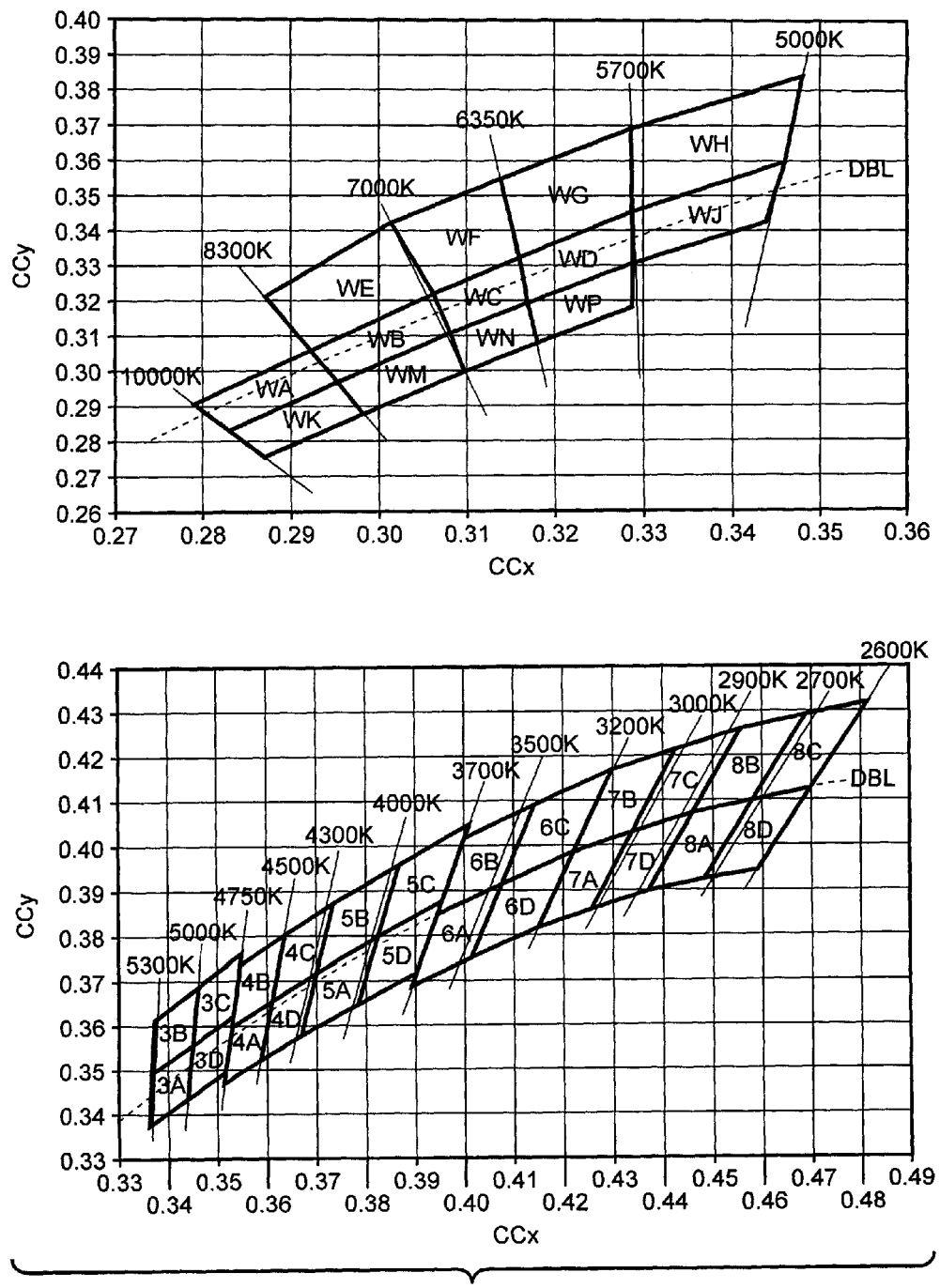
FIG. 3A is a chart showing exemplary binning chromaticity regions plotted on the 1931 CIE Coordinate system.
Figure 3B:
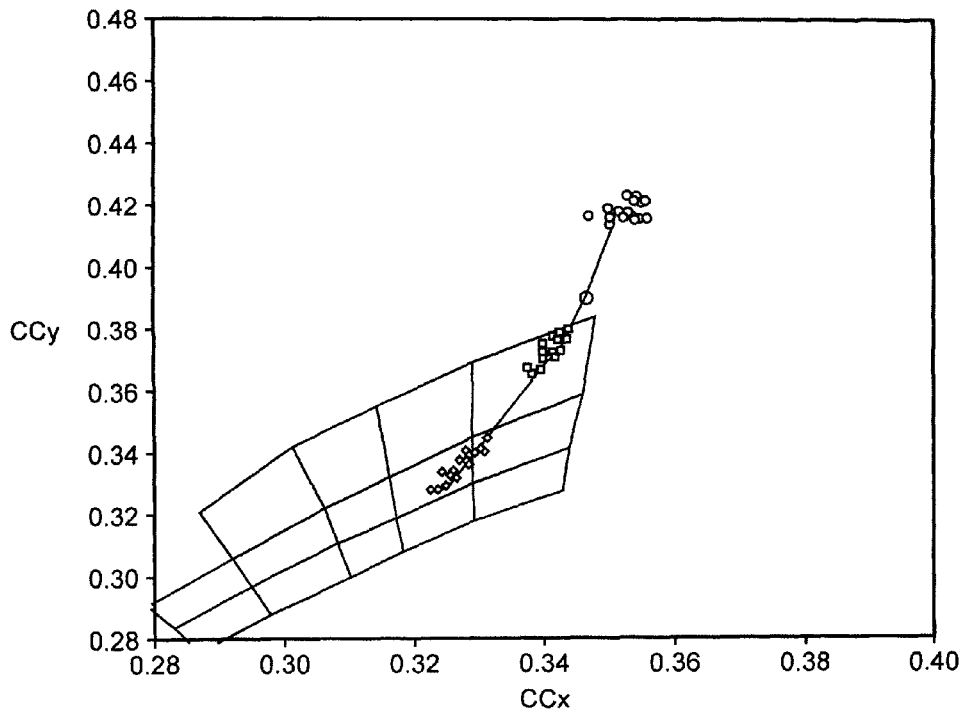
FIG. 3B is a chart showing a plurality of LEDs plotted in exemplary binning chromaticity regions plotted on the 1931 CIE Coordinate system.

The present application discloses new methods for fabricating semiconductor devices such as LED chips, with one embodiment of a fabrication method according to the present invention providing LED chip fabrication at the wafer level. The present application also discloses LED chips and LED packages fabricated using these methods. Different embodiments of the present invention disclose sequential coating methods that provide two or more coatings or layers of conversion material over LEDs. In one embodiment, the methods may be used to correct for wavelength variation of LED devices across a wafer, with corrective phosphors being applied to individual devices or groups of devices to ensure a degree of color uniformity. The methods according to the present invention are particularly applicable to fabricating LED chips that emit a warm white light, which typically requires covering LEDs with one or more wavelength conversion materials such as phosphors. In one embodiment, a base wavelength conversion material is applied to the semiconductor devices. A portion of the base conversion material is removed. At least two different tuning wavelength conversion materials are also applied to the semiconductor devices, either before or after the application of the base conversion material.

The present application also discloses methods for sequentially coating LEDs with two or more conversion coatings or layers at the wafer level while still allowing for contacting LED chips that are singulated from the wafer. In one such embodiment, the LEDs can have one or more pedestals that extend from the contacts on the LEDs up through the conversion layers. Such a structure is discussed in detail in U.S. patent application Ser. Nos. 11/656,759 and 11/899,790 to Chitnis, et al., both of which are commonly owned with the present application and incorporated by reference herein. Electrical contact is made to the LEDs through the one or more pedestals. Several processes can be used to remove phosphor over individual LEDs or regions of LEDs to further control or vary the emission characteristics of the LED chips. Tuning wavelength conversion materials can be added onto the chips to achieve a particular color point.

The present invention is described herein with reference to certain embodiments; however, it is understood that the invention can be embodied in many different forms and should not be limited to the embodiments set forth herein. In particular, the LED chips described herein can comprise many different layers and elements beyond those described herein.

Embodiments of the present invention are described herein with reference to conversion materials, wavelength conversion materials, phosphors, phosphor layers and related terms. The use of these terms should not be construed as limiting. It is understood that the use of the term phosphor, or phosphor layers is meant to encompass and be equally applicable to all wavelength conversion materials.

The term "color" as used herein with reference to light is meant to describe light having a characteristic average wavelength; it is not meant to limit the light to a single wavelength. Thus, light of a particular color (e.g., green, red, blue, yellow, etc.) includes a range of wavelengths that are grouped around a particular average wavelength.

It is also understood that when an element such as a layer or material is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or region to another layer or region. It is understood that these terms are intended to encompass different orientations of the device in addition to the orientation depicted in the figures.

Although the ordinal terms first, second, etc. may be used herein to describe various elements, components, regions, layers and/or materials, these elements, components, regions, layers and/or materials should not be limited by these terms. These terms are only used to distinguish one element, component, region, layer or material from another element, component, region, layer or material. Thus, a first element, component, region, layer or material discussed below could be termed a second element, component, region, layer or material without departing from the teachings of the present invention.

Embodiments of the invention are described herein with reference to cross-sectional view illustrations that are schematic illustrations of embodiments of the invention. The figures are not drawn to scale. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions/layers illustrated in the figures are schematic in nature. Their shapes are not intended to illustrate the precise shape of a region/layer of a device and are not intended to limit the scope of the invention.

Figure 4:
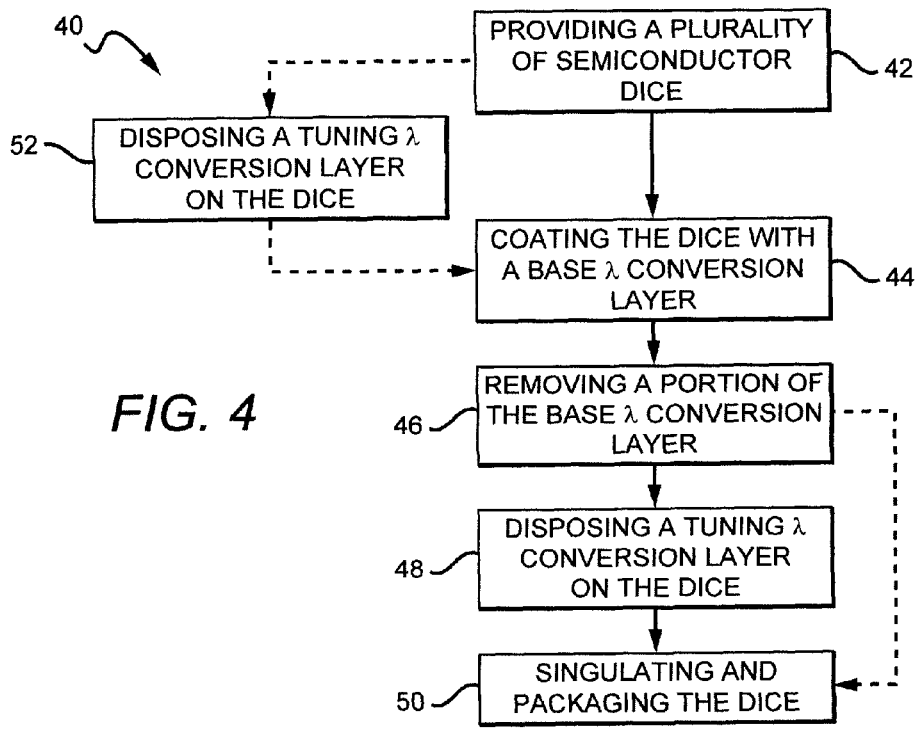
FIG. 4 is a flow chart showing a method for fabricating light emitting devices according to embodiments of the present invention.

FIG. 4 is a flow chart showing a method for fabricating light emitting devices according to embodiments of the present invention. Although the steps of practicing the method are shown in a particular order, it is understood that the steps can be performed in a different order and that other steps can be used. The dashed lines represent another embodiment of the method which is shown in FIG. 4 for convenience. The present method is described with reference to the fabrication of LEDs, but it is understood that it can be used to fabricate other solid state emitters and other semiconductor devices. The present method is also described with reference to coating of LEDs at the wafer level, but it is understood that methods can also be used in coating LEDs at the chip or package level.

In 42 LEDs are fabricated on a growth wafer or substrate, and the LEDs can have many different semiconductor layers arranged in different ways. The fabrication and operation of LEDs is generally known in the art and only briefly discussed herein. The layers of the LEDs can be fabricated using known processes with a suitable process being fabrication using metal organic chemical vapor deposition (MOCVD). The layers of the LEDs generally comprise an active layer/region sandwiched between first and second oppositely doped epitaxial layers, all of which are formed successively on the growth wafer or substrate ("wafer"). The LED layers can initially be formed as continuous layers across the substrate with the layers then partitioned or separated into individual LEDs. This separation can be achieved by having portions of the active region and doped layers etched down to the wafer to form the open areas between the LEDs. In other embodiments the active layer and doped layers can remain continuous layers on the wafer and can be separated into individual devices when the LED chips are singulated.

It is understood that additional layers and elements can also be included in each of the LEDs, including but not limited to buffer, nucleation, contact and current spreading layers as well as light extraction layers and elements. The active region can comprise single quantum well (SQW), multiple quantum well (MQW), double heterostructure or super lattice structures, and as is understood in the art, the oppositely doped layers are commonly referred to as n-type and p-type doped layers.

The LEDs may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In one embodiment, the n- and p-type layers are gallium nitride (GaN) and the active region is InGaN. In other embodiments the n- and p-type layers may be AlGaN, aluminum gallium arsenide (AlGaAs) or aluminum gallium indium arsenide phosphide (AlGaInAsP).

The wafer can be made of many materials such as sapphire, silicon carbide, aluminum nitride (AlN), GaN, with a suitable wafer being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the wafer (as may be the case with some devices formed on sapphire). SiC wafers are available from Cree Research, Inc., of Durham, N.C. and methods for producing them are set forth in the scientific literature as well as in U.S. Pat. Nos. Re. 34,861; 4,946,547; and 5,200,022.

Each of the LEDs can also have first and second contacts. The LEDs can have vertical geometry with a first contact on the substrate and a second contact on the LED top layer, which is typically a p-type layer. The first and second contacts can comprise many different materials such as gold (Au), copper (Cu) nickel (Ni), indium (In), aluminum (Al) silver (Ag), or combinations thereof. In still other embodiments the contacts can comprise conducting oxides and transparent conducting oxides such as indium tin oxide, nickel oxide, zinc oxide, cadmium tin oxide, titanium tungsten nickel, indium oxide, tin oxide, magnesium oxide, $ZnGa_2O_4$, $ZnO_2/Sb$, $Ga_2O_3/Sn$, $AgInO_2/Sn$, $In_2O_3/Zn$, $CuAlO_2$, $LaCuOS$, $CuGaO_2$ and $SrCu_2O_2$. The choice of material used can depend on the location of the contacts as well as the desired electrical characteristics such as transparency, junction resistivity and sheet resistance. In the case of Group-III nitride devices, it is known that a thin semitransparent current spreading layer typically can cover some or the entire p-type layer. It is understood that the second contact can include such a layer which is typically a metal such as platinum (Pt) or a transparent conductive oxide such as indium tin oxide (ITO), although other materials can also be used. Embodiments of the present invention can also be used with LEDs having lateral geometry wherein both contacts are on the top of the LEDs. The LEDs can also comprise additional current spreading structures or grids.

In one embodiment, each of the LEDs can further comprise one or more pedestals to provide electrical contact to a respective one of the LED's contacts after phosphor coating of the LEDs. This embodiment is described in more detail below and in white chip patent applications U.S. patent application Ser. Nos. 11/656,759 and 11/899,790, referred to herein.

In an optional step, a good die map can be generated for the wafer based on a visual and electrical/optical inspection. The map can indicate the emission wavelengths for the LEDs across the wafer as well as LEDs that are defective. For example, a wafer of blue emitting LEDs can have a certain number of defective devices and in some embodiments the operating devices can experience emission wavelength variations of approximately 25 nm (i.e., ranging from 445 to 470 nm).

In one embodiment a base wavelength conversion layer is coated onto a plurality of semiconductor devices. In 44, the base conversion coating/layer is applied to the wafer that comprises the LEDs, with the base coating in one embodiment comprising a first conversion material in a binder. The base conversion layer can be applied using different known processes such as "glob" dispensing, electrophoretic deposition, electrostatic deposition, printing, jet printing, screen printing, or spin coating. In other embodiments the base conversion layer can be provided as a separately fabricated preform that can be bonded or mounted over the LEDs.

In one embodiment, the base conversion layer can be deposited over the wafer in a phosphor/binder mixture using spin coating. Spin coating is known in the art and generally comprises depositing the desired amount of binder and phosphor mixture on the substrate containing the semiconductor devices and spinning the substrate at high speed. The centrifugal acceleration causes the mixture to spread to and eventually off the edge of the substrate. Final layer thickness and other properties of the base conversion layer depend on the nature of the mixture (viscosity, drying rate, percent phosphor, surface tension, etc.) and the parameters chosen for the spin process. For large wafers it may be useful to dispense the phosphor/binder mixture over the substrate before spinning the substrate at high speed.

In other embodiments, the base conversion layer can be deposited on the wafer using known electrophoretic deposition methods. The wafer and the LEDs thereon are exposed to a solution containing phosphor particles suspended in a liquid. An electrical signal applied between the solution and the LEDs creates an electrical field that causes the phosphor particles to migrate to and deposit on the LEDs. The process typically leaves the phosphor blanketed over the LEDs in powder form. A binder can then be deposited over the phosphor with the phosphor particles sinking into the binder to form the first conversion layer. The binder can be applied using many known methods and in one embodiment, the binder coating can be applied using spin coating.

The base conversion layer can then be cured using many different curing methods depending on different factors such as the type of binder used. Different curing methods include but are not limited to heat, ultraviolet (UV), infrared (IR) or air curing. Different materials can be used for the binder, with materials preferably being robust after curing and substantially transparent in the visible wavelength spectrum. Suitable material include silicones, epoxies, glass, inorganic glass, spin-on glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. In other embodiments, the base coating can be textured or can be engineered to be index matched with the features such as the chip (semiconductor material) and growth substrate, which can reduce total internal reflection (TIR) and improve light extraction. Similarly, the surface of the LEDs can be textured to improve light extraction.

The base conversion layer preferably contains one or more light conversion materials that absorb light from the LEDs and re-emit light at a different wavelength, such as down-converting the light to a longer wavelength. Many different conversion materials can be used, with a suitable material being a first phosphor. Different factors determine the amount of LED light that will be absorbed by the first phosphor in the final LED chips, including but not limited to the size of the phosphor particles, the percentage of phosphor loading, the type of binder material, the efficiency of the match between the type of phosphor and wavelength of emitted light, and the thickness of the first coating. These different factors can be controlled to control the emission wavelength of the LED chips according to the present invention.

Many different phosphors can be used in the base conversion layer. The present invention is particularly adapted to LED chips emitting white light including warm white light. In one embodiment the LEDs across a wafer can emit light in the blue wavelength spectrum, and yellow, red, and green phosphors are used to produce a desired warm white light hue. The phosphors absorb some of the blue light and re-emit yellow, red, and green light, with the LED chips emitting a white light combination.

Different sized phosphor particles can be used including but not limited to 10-100 nm sized particles to 20-30 µm sized particles, or larger. Smaller particle sizes typically scatter and mix colors better than larger sized particles to provide a more uniform output. Larger particles are typically more efficient at converting light compared to smaller particles because they are predominantly forward scattering, but can emit a less uniform light pattern. In one embodiment, the particle sizes are in the range of 2-15 µm. The coating can also have different concentrations (i.e., loading) of phosphor materials in the binder, with a typical concentration being in the range of 30-70% by weight. In one embodiment, the phosphor concentration is approximately 65% by weight, and in some embodiments the phosphor is uniformly dispersed throughout the binder.

In one embodiment, the base conversion layer can comprise be a yellow phosphor. Many different types of phosphors can be used such as commercially available cerium-doped yttrium aluminum garnet (YAG:Ce). A full range of broad yellow spectral emission is possible using conversion particles made of phosphors based on the $(Gd, Y)_3(Al, Ga)_5O_{12}$:Ce system, such as the $Y_3Al_5O_{12}$:Ce (YAG). Many other yellow phosphors may be used in white emitting LED chips including, for example:

$Tb_{3-x}RE_xO_{12}$:Ce (TAG); RE=Y, Gd, La, Lu; or

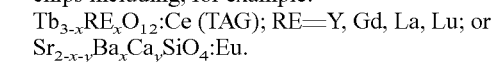

The particular yellow phosphor should be chosen to compliment other phosphors being used in the light emitting device. The type and concentration of the yellow and red phosphors should be selected to provide the desired hue of white light, and the yellow phosphor should be selected.

In step 46, a portion of the base conversion layer is removed. This step can be implemented using several known subtractive methods. For example, the base conversion layer can be ground or planarized as desired. This may be done for different reasons, such as to control emission characteristics of the LED chips with less of the LED light being absorbed and re-emitted by the LED chips when there is less conversion material present. Alternatively, this can be done to expose pedestals on the top surface of the LEDs across the wafer. This is particularly applicable in methods used to coat LEDs with pedestals, as described in U.S. patent application Ser. Nos. 11/656,759 and 11/899,790, both entitled "Wafer Level Phosphor Coating Method and Devices Fabricated Utilizing Method" and incorporated above. Different portions of the pedestals can be exposed and in some embodiments just the top of the pedestals are exposed. Many different thinning or planarizing processes can be used including known mechanical processes such as grinding, lapping or polishing, preferably after the binder has cured. Other fabrication methods can comprise a squeegee to thin the coating before cured or pressure planarization can also be used before the coating is cured. Still in other embodiments the coating can be thinned using physical or chemical etching, or ablation. The coating can have many different thicknesses following planarization, with a range of thicknesses in one embodiment being 1 to 100 µm.

In 46 an alternative step of micromachining the base conversion material can be performed to tune the emission characteristics by removing portions of the base conversion layer in selected areas. This is particularly applicable to methods of fabricating LEDs with pedestals where portions of the first coating are removed without removing additional portions of the pedestals. One purpose of this step can be removal of the base conversion layer between the pedestals to allow for the additional conversion layers to be applied to the LEDs while still allowing for access to the pedestals, as described in detail herein. Without this step, the additional conversion layers would bury the pedestals, and planarizing the second conversion layer down the pedestals would result in all or most of these conversion layers being removed. This step can also be used to tune the amount of first phosphor over the LED as described in U.S. Provisional Patent Application No. 61/072,546 entitled "Emission Tuning Methods and Devices Fabricated Utilizing Methods", incorporated by reference as though fully set forth herein.

Base conversion material removal in 46 can also be accomplished using several known techniques such as chemical, physical, mechanical etching and photo-ablation. There are several known techniques to chemically etch various phosphors and/or binding materials (resins, silicones, glass etc). Examples of physical etching include sputtering of the phosphor layer by high energy species. These could be plasma etching, physical sputtering using abrasive media such as polycarbonates, alumina, dry ice, etc. A selective area sandblasting or gas (CO2) blasting can also be used where a nozzle crystallizes the gas as it exits, with the crystals used as the blasting compound. In each of these blasting embodiments, a mask can be used to protect the areas where the conversion layer thickness is not to be reduced by the sand or gas crystal blasting. Requiring a masking layer can increase the process steps and cost of etching techniques. Abrasive media should also be completely removed from the devices, which can require expensive vacuum removing techniques.

Another method that can be used is mechanical etching such as grinding/milling, drilling. This process can be less complicated and less costly than other processes and can utilize grinding and drilling bits of appropriate size, shape based on the machining application. Conversion layers over large area (such as a few millimeters), intermediate area (1-5 mm) and small area (less than 1 mm) can be removed in a single step on a CNC machine tool.

In other embodiments, the base conversion layer can be removed by machining through laser ablation, which is a known process of removing material by irradiating it with a laser beam. Using a low laser flux, the material can be heated by the absorbed laser energy and evaporates or sublimates. At high laser flux, the material can be typically converted to a plasma. Laser ablation typically removes material with a pulsed laser, but it is possible to ablate material with a continuous wave laser beam if the laser intensity is high enough. In one embodiment, the material is removed in a series of holes formed in the conversion layer over the LED, with the number, depth and spacing of the holes determined by the target emission characteristics of the LED and the corresponding amount of conversion layer material to be removed to reach that target.

In still other embodiments, the base conversion layer material can be removed by machining using micro drilling. This typically comprises using a mechanical drill to form holes in the base conversion layer over the devices. Like laser ablation the number, depth and spacing of the holes is determined by the target emission characteristics of the LED and the amount of conversion layer material to be removed. In some embodiments it may be desirable to remove more of the base conversion material than is necessary to achieve light emission at a desired color point as discussed in more detail herein.

In step 48 a tuning wavelength conversion material is disposed on the semiconductor devices. The tuning conversion material comprises at least a first tuning phosphor. In one embodiment, green and red phosphors are used as first and second tuning phosphors. The amount of each phosphor to be disposed on each die is calculated based on the difference between the observed wavelength of each die and the target color point for all the devices on the wafer. The volume of the phosphors can be calculated using many different methods, at least one of which is discussed in more detail herein.

In order to determine the necessary amounts of the first and second tuning phosphors, the wafer can be probed at different points during fabrication to measure the output lighting characteristics of the LED chips across the wafer as described above. In one embodiment, the wafer is probed after the base conversion layer removal step 46. Once the devices are probed a map of the may be developed based on the output characteristics of the probed LEDs or regions of LEDs. This allows for the physical thickness, and therefore, optical thickness of the conversion layers to be calculated based on the output characteristics of each of the LEDs across the wafer.

Once the quantity of the first and second tuning phosphors is calculated for each device (or region of devices) the phosphors are then dispensed onto each device. In one embodiment, the tuning phosphors may be applied with a pin/needle dispense method. In another embodiment, an ink jet may be used. Other dispense tools are also possible. Some of these tools can be used to dispense the phosphors in small dots over the devices. The first and second phosphor dots can be applied one on top the other or side by side. Additionally, the tuning phosphors can be dispensed over regions of devices in a single step, if all or most of the devices in that region require a similar wavelength correction.

In this embodiment, the tuning phosphors are also used to adjust for thickness variations inherent in applying the base phosphor. After the wafer is probed, the amount of the tuning phosphors to be dispensed over each device compensates for the difference in light output owing to the thickness variation of the base phosphor. Thus, the actual thickness variation of the base phosphor across the wafer does not need to be measured, reducing the complexity of the process and saving time.

In one embodiment, the semiconductor wafer is heated prior to the application of the first and second tuning phosphors. The tuning phosphors can be mixed in a binder mixture such that the materials will be snap-cured upon application to a wafer that has been heated to a minimum temperature. Snap-curing the phosphors on contact with the heated wafer provides a way to spatially confine the phosphors over each device. This method prevents the tuning phosphors from running outside the desired application area immediately after they are dispensed. In another embodiment, the tuning phosphors may be snap-cured using light, such as a laser, for example.

FIG. 4 also shows an alternative method for fabricating light emitting devices as indicated by the dashed lines. In this embodiment, the tuning phosphors may be applied to the semiconductor devices first as shown in step 52. Then the devices are coated with the base phosphor (step 44) with a portion of the base phosphor then being removed (step 46) to achieve the desired color output for each device. The devices are then singulated and packaged (step 50).

Figure 5A:
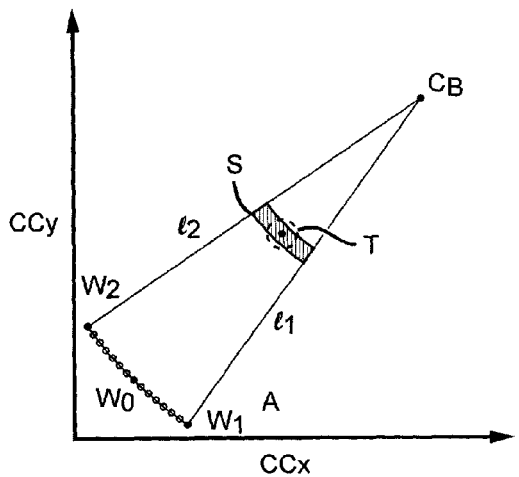
FIG. 5a is a graph of a CIE diagram in which the wavelength output of several exemplary semiconductor devices is shown during a certain step of fabrication.

The volumes of the tuning phosphors that should be dispensed over each device/region can be calculated using various methods. The precise calculations depend on many details of the phosphors, including but not limited to particle size, excitation, and absorption characteristics. For the purpose of illustrating the key idea, a simplified description is provided here. In practice, the simplified approach may be used to provide initial estimates, which are then refined through empirical results. FIG. 5*a* shows a graph of a CIE diagram in which the wavelength output of several exemplary semiconductor devices is shown. In this particular example, the devices have a nominal wavelength ($W_0$) in the blue range. In an ideal fabrication process, all of the devices would have an initial output equal to the nominal output; however, in reality, as shown at region A in the graph, there is noticeable variation in wavelength output of the devices across the entire wafer, creating a locus of points on the CIE diagram. Region A represents the devices at step 42 in the fabrication process, before any wavelength conversion material has been applied.

After the base conversion layer is applied, the output wavelength of the devices is shifted along a tie line (l) drawn between the nominal blue wavelength W and the nominal wavelength of the base conversion layer ($C_B$). Before a portion of the base conversion layer is removed, as in step 46, the output of the devices actually lies further along the tie line toward $C_B$. The locus of points in region S is representative of the range of color points possible with a single phosphor, $C_B$, given the initial range of blue wavelengths $W_1$ to $W_2$. The coated devices in region S represent the devices at step 44 of the fabrication process. As shown, only a device with the initial wavelength very close to $W_0$ can end up at the target color point (T) after the single base phosphor is applied. All other devices will end up somewhere within region S at a distance from the target color point T. The size of the region T is determined based on tolerance for variation from the target output wavelength, typically defined by customer/industry specification. Typically, the desired size of the region is significantly smaller than is achievable using a single phosphor for practical ranges of the blue wavelengths (such as those shown in FIG. 1). Ideally, the region T is defined by a 1-step MacAdam ellipse, wherein all color points are indistinguishable to the human eye. Although in some embodiments, it may be acceptable to have a region T that is defined by a 2-step MacAdam ellipse. In others, a 3-step MacAdam ellipse is suitable.

Figure 5B:
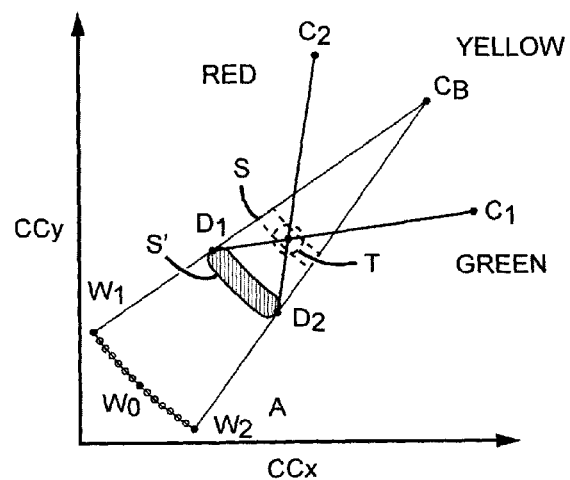
FIG. 5b is a graph of a CIE diagram in which the wavelength output of several exemplary semiconductor devices is shown during a certain step of fabrication.

In FIG. 5b, after a portion of the base conversion layer is removed, the outputs are pushed back into region S', as shown in the graph. In this case, the output region S' is purposely pushed back farther than the final target output wavelength region T of the devices. This is done so that even devices at the extreme edges of region S' ($D_1$ and $D_2$) can be corrected toward the target color point T. For example, to be able to tune devices D1 and D2 to the target T, the color point before adding the tuning phosphor must be at or below the tie line connecting that color point to the appropriate tuning phosphor. This sets a constraint on the maximum thickness of the base phosphor. If the thickness of the base phosphor is fixed due to the method used to control it (e.g., grinding) then the base phosphor may be too thin to reach the target color point even for regions on the wafer that have a non-extreme blue wavelengths near $W_0$. Instead, one would have to add a little of both tuning phosphors to the now too thin base phosphor to hit the target. If, however, the base phosphor thickness can vary locally then this constraint no longer exists, and the base phosphor can have the correct thickness wherever the blue wavelength allows the target color point to be hit without tuning.

Two exemplary devices $D_1$ and $D_2$ are shown at the extreme edges of region S'. These devices represent the wavelength outputs on both ends of the range in this region. In the next step 48, the tuning wavelength conversion materials are applied. The tuning materials can be chosen to have many different color points, depending on the corrections that are necessary. In the graph, color points $C_1$ and $C_2$ represent the tuning material wavelengths with $C_1$ corresponding to a green color point (e.g., a green phosphor) and $C_2$ corresponding to a red color point (e.g., a red phosphor). Many different materials can be chosen to achieve the desired corrections. Indeed, because only a very small amount of the tuning materials would be necessary for the corrective step, the materials may be chosen from a broad list. In more traditional corrective processes that use larger quantities of the tuning materials, the tuning materials might have been limited to cheaper phosphors that are readily obtained; whereas, in embodiments of the fabrication methods discussed herein more exotic tuning materials can be used without unreasonably increasing the cost of the process. This allows for greater flexibility in the specific color points that may be used in the corrective process and, thus, better accuracy in the final device output. Furthermore, only a single base conversion material is needed for bulk shifting the color point of all of the devices on the wafer.

Depending on the wavelength output of the respective devices within region S', a quantity of one or more of the tuning materials is applied to each of the devices using methods discussed herein or other known methods. This quantity can be calculated based on where each device output lies within region S' in relation to the target output region T. Some devices may only require one of the tuning materials, while most will require a quantity of both. For example, $D_1$ lies on the extreme edge of region S', toward the red end of the CIE diagram. Thus, $D_1$ would only require an application of the green tuning material to move it toward color point $C_1$ and into the target region T. The opposite is true for $D_2$. Because $D_2$ lies on the edge of region S' toward the green area of the CIE diagram, $D_2$ would only require the red tuning material at color point $C_2$ to move it into the target output region T.

Figure 5C:
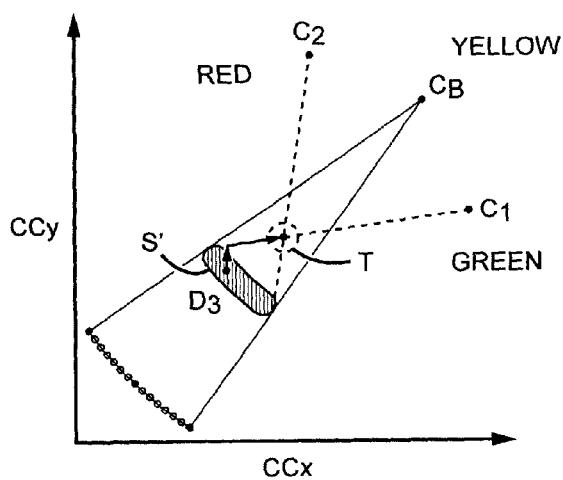
FIG. 5c is a graph of a CIE diagram in which the wavelength output of several exemplary semiconductor devices is shown during a certain step of fabrication.

As shown in FIG. 5c, all other devices whose outputs lie somewhere inside region S' would require some of both tuning materials to make the necessary correction. For example, device $D_3$ lies within region S'. Thus, a blend of the tuning phosphors $C_1$ and $C_2$ would be necessary to move the color point of $D_3$ into target region T. The proportion of each tuning phosphor may be calculated using various methods. One method includes resolving the tie line between the device color point and the target point T into vectors parallel with the tie lines connecting the extreme points of region S' with the tuning phosphor color points $C_1$, $C_2$. As shown, device $D_3$ requires a smaller proportion of phosphor $C_2$ because the device $D_3$ is already farther toward the green region of the CIE chart; whereas, a greater proportion of the red phosphor $C_1$ is necessary to move device $D_3$ a farther distance toward the green region.

Figure 5D:
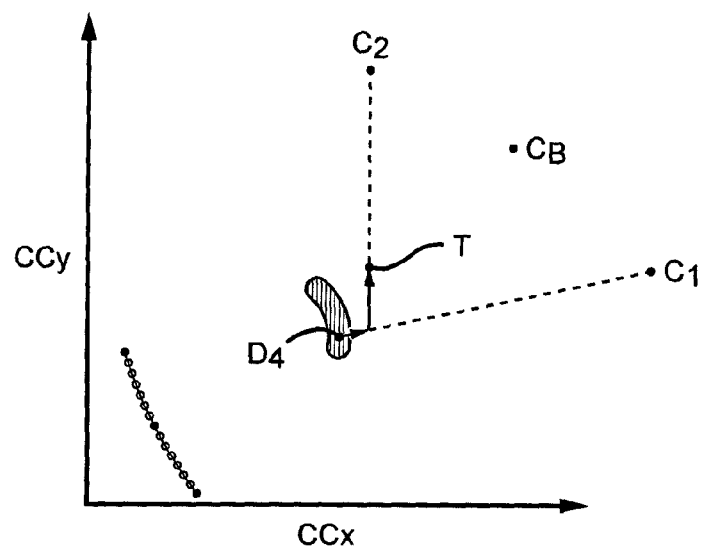
FIG. 5d is a graph of a CIE diagram in which the wavelength output of several exemplary semiconductor devices is shown during a certain step of fabrication.

FIG. 5d shows a similar adjustment wherein device $D_4$ is shifted along the tuning phosphor tie lines to a target color point T. The tuning phosphors $C_1$, $C_2$ can be used to correct for characteristics other than wavelength variation. For example, corrections can be made for thickness variation and/or excitation strength versus wavelength variations.

Figure 6:
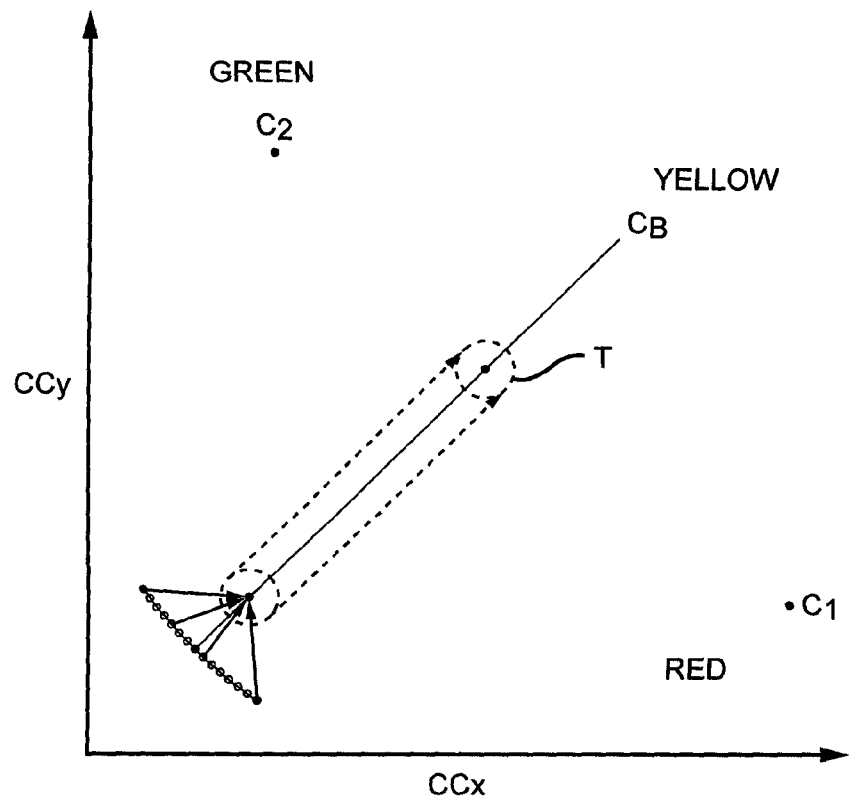
FIG. 6 is a graph showing the outputs of exemplary devices fabricated using a fabrication method according to an embodiment of the present invention.

FIG. 6 shows a graph showing the outputs of exemplary devices fabricated according to another embodiment of the fabrication method. As previously discussed, the tuning materials can be added first based on the initial wavelength output of the devices to bring the devices in closer to the tie line l. Then the base conversion material can be added (and scaled back if necessary) to achieve the bulk shift of all the devices along the tie line l toward the target region T.

After the corrective step 48 (or 46), the devices can then be singulated using known methods and integrated into device packages. Methods described herein may be used to fabricate devices for several different kinds of packages. For example, the methods can be used to fabricate packages having two top-side contacts in which the base conversion layer has been spin coated onto the devices as discussed previously with reference to incorporated U.S. patent application Ser. Nos. 11/656,759 and 11/899,790. The methods can also be used to fabricate devices designed to have both contacts accessible from the bottom side. In such a device the base conversion material can be spray coated on, for example. Thus, the fabrication methods disclosed herein are versatile, allowing for the manufacture of many different devices for inclusion in a wide range of package applications.

Although the present invention has been described in detail with reference to certain preferred configurations thereof, other versions are possible. For example, the present invention can be used with many different device configurations (geometries, shape, size and other elements on, in and around the chip) to improve device performance. Therefore, the spirit and scope of the invention should not be limited to the versions described above.

We claim:

1. A method for fabricating light emitting devices, comprising:
    coating a plurality of semiconductor devices with a base wavelength conversion material, said semiconductor devices emitting over a range of wavelengths;
    removing a portion of said base wavelength conversion material; and
    disposing a tuning wavelength conversion material on said plurality of semiconductor devices, said tuning wavelength material comprising at least two tuning phosphors each having a different emission spectrum, such that said emission spectrums are also different from an emission spectrum of said base wavelength conversion material;
    wherein the volume of said tuning wavelength conversion material is calculated based on the output lighting characteristics of said semiconductor devices and said base wavelength conversion material.

2. The method of claim 1, where said tuning wavelength conversion material comprises at least first and second phosphors.

3. The method of claim 2, said tuning wavelength conversion material comprising said first and second phosphors in an approximate volumetric ratio.

4. The method of claim 2, wherein said semiconductor devices are fabricated to emit blue light, said base wavelength conversion material comprises a yellow phosphor, said first tuning phosphor comprises a red tuning phosphor, and said second tuning phosphor comprises a green tuning phosphor.

5. The method of claim 1, wherein said tuning wavelength conversion material is disposed onto each of said semiconductor devices individually.

6. The method of claim 1, wherein said tuning wavelength conversion material is disposed onto multiple semiconductor devices at the same time.

7. The method of claim 1, further comprising probing said semiconductor devices prior to disposing said tuning wavelength conversion material to determine the properties and quantity of said tuning wavelength conversion material necessary to achieve a desired color point.

8. The method of claim 1, further comprising calculating the volume of said at least one tuning phosphors to be disposed over each of said semiconductor devices.

9. The method of claim 1, further comprising heating said semiconductor devices prior to disposing said tuning wavelength conversion material thereon.

10. The method of claim 1, further comprising removing a portion of said base wavelength conversion material.

11. The method of claim 10, wherein said removing a portion of said base wavelength conversion material comprises removing more of said base wavelength conversion material than is necessary to achieve light emission at a desired color point.

12. The method of claim 10, wherein said removing a portion of said base wavelength conversion material comprises grinding said base wavelength conversion material down to a desired thickness.

13. The method of claim 10, wherein said removing a portion of said base wavelength conversion material comprises etching said base wavelength conversion material down to a desired thickness.

14. The method of claim 1, wherein disposing said tuning wavelength conversion material on said plurality of semiconductor devices comprises spraying said tuning wavelength conversion material onto each of said semiconductor devices.

15. The method of claim 14, wherein said tuning conversion material is sprayed onto said semiconductor devices using a single nozzle.

16. The method of claim 14, wherein said tuning conversion material is sprayed onto said semiconductor devices using multiple nozzles.

17. The method of claim 1, wherein said base wavelength conversion layer is applied to said semiconductor devices first, and the tuning wavelength conversion material is applied to said semiconductor device thereafter.

18. The method of claim 1, wherein said tuning wavelength material is applied to said semiconductor devices first, and said base wavelength material is applied to said semiconductor devices thereafter.

19. The method of claim 1, wherein said light emitting devices emit within a color point region defined by a 3-step MacAdam ellipse.

20. The method of claim 1, wherein said light emitting devices emit within a color point region defined by a 2-step MacAdam ellipse.

21. The method of claim 1, wherein said light emitting devices emit within a color point region defined by a 1-step MacAdam ellipse.

22. A light emitting device comprising:
    an emitter structure;
    a base conversion layer comprising a first wavelength conversion material on said emitter structure; and
    a tuning conversion layer comprising at least second and third wavelength conversion materials on said emitter structure, said second and third wavelength conversion materials each having a different emission spectrum, such that said emission spectrums are also different from an emission spectrum of said base conversion layer;
    wherein the volume of said tuning conversion layer is calculated based on the output lighting characteristics of said emitter structure and said base conversion layer.

23. The light emitting device of claim 22, said tuning conversion layer comprising said second and third wavelength conversion materials in an approximate volumetric ratio.

24. The light emitting device of claim 22, said second wavelength conversion material comprising a red phosphor and said third wavelength conversion material comprising a green phosphor.

25. The light emitting device of claim 22, wherein said emitter structure is fabricated to emit light in the blue wavelength range.

26. The light emitting device of claim 22, said light emitting structure comprising a plurality of light emitters.

27. The light emitting device of claim 22, wherein said light emitting device emits within a color point region defined by a 3-step MacAdam ellipse.

28. The light emitting device of claim 22, wherein said light emitting device emits within a color point region defined by a 2-step MacAdam ellipse.

29. The light emitting device of claim 22, wherein said light emitting device emits within a color point region defined by a 1-step MacAdam ellipse.

30. A light emitter package, comprising:
- at least one light emitter on a surface;
- first and second electrodes electrically connected to said at least one emitter;
- a base conversion layer comprising a first wavelength conversion material; and
- a tuning conversion layer comprising at least second and third wavelength conversion materials, said second and third wavelength conversion materials each having a different emission spectrum, such that said emission spectrums are also different from an emission spectrum of said base conversion layer;
- wherein the volume of said tuning conversion layer is calculated based on the output lighting characteristics of said at least one emitter and said base conversion layer.

31. The light emitter package of claim 30, said tuning conversion layer further comprising a binder material, said second and third wavelength conversion materials intermixed in said binder.

32. The light emitter package of claim 30, said at least one light emitter fabricated to emit blue light, said first wavelength conversion material comprising a yellow phosphor, said second wavelength conversion material comprising a green phosphor, and said third wavelength conversion material comprising a red phosphor.

33. The light emitter package of claim 30, wherein said second and third wavelength conversion materials are disposed in said tuning conversion layer in an approximate volumetric ratio.

34. The light emitter package of claim 30, said light emitter package designed to output white light.

35. The light emitter package of claim 30, wherein said at least one light emitter device emits within a color point region defined by a 3-step MacAdam ellipse.

36. The light emitter package of claim 30, wherein said at least one light emitter device emits within a color point region defined by a 1-step MacAdam ellipse.

37. The light emitter package of claim 30, wherein said at least one light emitter device emits within a color point region defined by a 2-step MacAdam ellipse.

\* \* \* \* \*